US009865333B2

(12) United States Patent
Dhori et al.

(10) Patent No.: US 9,865,333 B2
(45) Date of Patent: Jan. 9, 2018

(54) TEMPERATURE COMPENSATED READ ASSIST CIRCUIT FOR A STATIC RANDOM ACCESS MEMORY (SRAM)

(71) Applicant: STMicroelectronics International N.V., Amsterdam (NL)

(72) Inventors: Kedar Janardan Dhori, Ghaziabad (IN); Ashish Kumar, Ranchi (IN); Hitesh Chawla, Kaithal (IN); Praveen Kumar Verma, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/132,680

(22) Filed: Apr. 19, 2016

(65) Prior Publication Data

US 2017/0301396 A1 Oct. 19, 2017

(51) Int. Cl.
*G11C 11/00* (2006.01)
*G11C 11/419* (2006.01)

(52) U.S. Cl.
CPC ................... *G11C 11/419* (2013.01)

(58) Field of Classification Search
CPC ... G11C 11/418; G11C 11/412; G11C 11/417; G11C 5/147; G11C 16/0491; G11C 16/28; G11C 7/062; G11C 7/067; G11C 7/14
USPC ..... 365/189.09, 201, 154, 185.18, 212, 226, 365/185.24, 185.25, 185.27, 189.07, 365/189.11, 203, 210.1, 210.12, 211, 365/225.7, 230.03, 230.06
See application file for complete search history.

(56) References Cited

U.S. PATENT DOCUMENTS

| 6,496,422 | B2* | 12/2002 | Marr ..................... G11C 11/418 365/189.09 |
| 6,788,566 | B1 | 9/2004 | Bhavnagarwala et al. |
| 7,366,006 | B2 | 4/2008 | Zhang |
| 7,505,345 | B2 | 3/2009 | Wang et al. |
| 7,636,268 | B1 | 12/2009 | Peng |
| 7,643,372 | B2 | 1/2010 | Yamagami |
| 7,672,182 | B2 | 3/2010 | Park et al. |
| 7,852,688 | B2 | 12/2010 | Terzioglu et al. |

(Continued)

OTHER PUBLICATIONS

Yabuuchi, Makoto et al: "A 45nm Low-Standby-Power Embedded SRAM with Improved Immunity Against Process and Temperature Variations," ISSCC 2007, Session 18, SRAM, 18.3, 2007 IEEE International Solid-State Circuits Conference, 2007 IEEE, pp. 326, 327, and 606.

*Primary Examiner* — Thong Q Le
(74) *Attorney, Agent, or Firm* — Gardere Wynn Sewell LLP

(57) ABSTRACT

A memory circuit includes a wordline, memory cells connected to the wordline and a wordline driver circuit including a p-channel pull-up transistor. The memory circuit further includes a read assist circuit including an n-channel pull-down transistor having a source-drain path connected between the wordline and a ground node and an n-channel diode-connected transistor having a source-drain path connected between a positive supply node and a gate terminal of the n-channel pull-down transistor. The n-channel diode-connected transistor is configured to apply a biasing voltage to the gate terminal of the n-channel pull-down transistor that is a relatively lower voltage for relatively lower temperatures and a relatively higher voltage for relatively higher temperatures.

22 Claims, 3 Drawing Sheets

(56) References Cited

U.S. PATENT DOCUMENTS

| | | |
|---|---|---|
| 8,755,239 B2 | 6/2014 | Holla et al. |
| 2014/0112065 A1* | 4/2014 | Tanabe ................. G11C 11/419 |
| | | 365/154 |
| 2014/0307500 A1 | 10/2014 | Su et al. |
| 2016/0172023 A1* | 6/2016 | Nii .......................... G11O 5/06 |
| | | 365/154 |

* cited by examiner

TEMPERATURE COMPENSATED READ ASSIST CIRCUIT FOR A STATIC RANDOM ACCESS MEMORY (SRAM)

TECHNICAL FIELD

The present invention relates to integrated memory circuits and in particular to a read assist circuit for a static random access memory (SRAM).

BACKGROUND

Reference is made to FIG. 1 which shows a schematic diagram of a standard memory circuit 10 including a six transistor (6T) static random access memory (SRAM) cell 12, a wordline driver 14 and an address decoder 16. The cell 12 includes two cross-coupled CMOS inverters 22 and 24, each inverter including a series connected p-channel and n-channel MOSFET transistor pair. The inputs and outputs of the inverters 12 and 14 are coupled to form a latch circuit having a true data storage node QT and a complement data storage node QB. The cell 12 further includes two transfer (passgate) transistors 26 and 28 whose gate terminals are driven by a wordline (WL). Transistor 26 is source-drain connected between the true data storage node QT and a node associated with a true bitline (BLT). Transistor 28 is source-drain connected between the complement data storage node QB and a node associated with a complement bitline (BLB). The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, Gnd) at a low supply node. The high supply voltage Vdd at the high supply node and the low supply voltage Gnd at the low supply node comprise the power supply set of voltages for the cell 12. The wordline WL is coupled to the output of the wordline driver circuit 14 including a series connected p-channel and n-channel MOSFET transistor pair forming a logic inverter. The wordline driver circuit 14 is also coupled to receive the high supply voltage (Vdd) at the high supply node and is referenced to the low supply voltage (Gnd) at the low supply node. The input of the wordline driver circuit 14 is coupled to an output of the address decoder 16. The address decoder 16 receives an address (Addr), decodes the received address and selectively actuates the wordline through the wordline driver circuit 14.

SUMMARY

In an embodiment, a circuit comprises: a wordline; a plurality of memory cells connected to the wordline; a pull-down transistor having a source-drain path connected between the wordline and a ground node; and a bias circuit configured to apply a temperature dependent biasing voltage to a control terminal of the pull-down transistor.

In an embodiment, a circuit comprises: a wordline; a plurality of memory cells connected to the wordline; a wordline driver circuit including a p-channel pull-up transistor; an n-channel pull-down transistor having a source-drain path connected between the wordline and a ground node; and an n-channel diode-connected transistor having a source-drain path connected between a positive supply node and a gate terminal of the n-channel pull-down transistor, said n-channel diode-connected transistor configured to apply a temperature dependent biasing voltage to the gate terminal of the n-channel pull-down transistor.

In an embodiment, a circuit comprises: a wordline; a plurality of memory cells connected to the wordline; a wordline driver circuit including a p-channel pull-up transistor; an n-channel pull-down transistor having a source-drain path connected between the wordline and a ground node; and an n-channel diode-connected transistor having a source-drain path connected between a positive supply node and a gate terminal of the n-channel pull-down transistor, said n-channel diode-connected transistor configured to apply a biasing voltage to the gate terminal of the n-channel pull-down transistor that is a relatively lower voltage for relatively lower temperatures and a relatively higher voltage for relatively higher temperatures.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
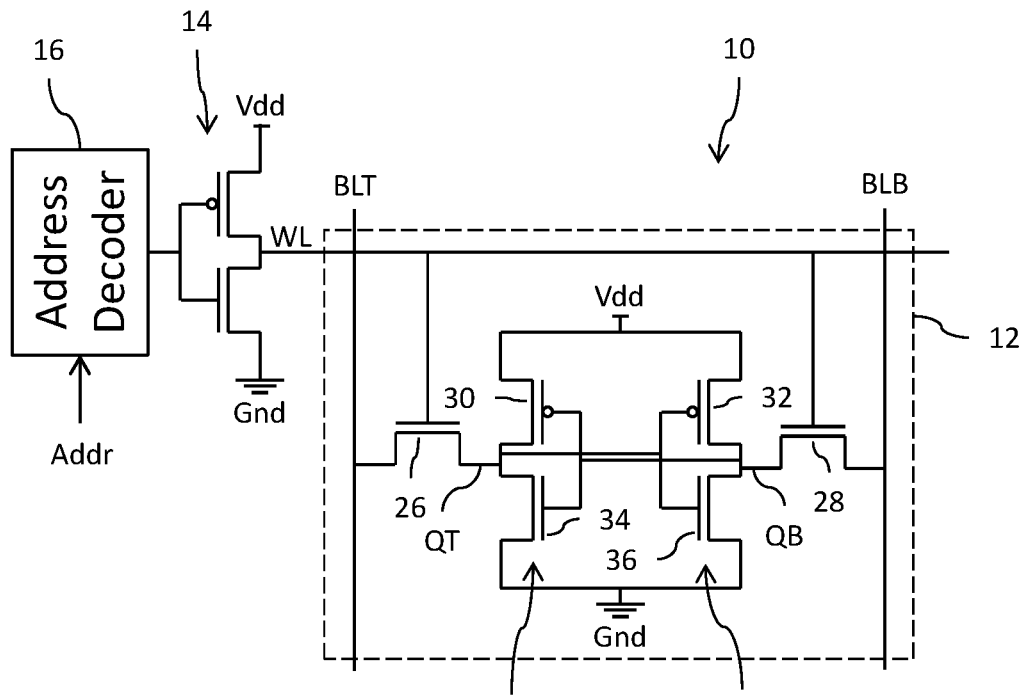
FIG. 1 is a schematic diagram of a standard memory circuit.
Figure 2:
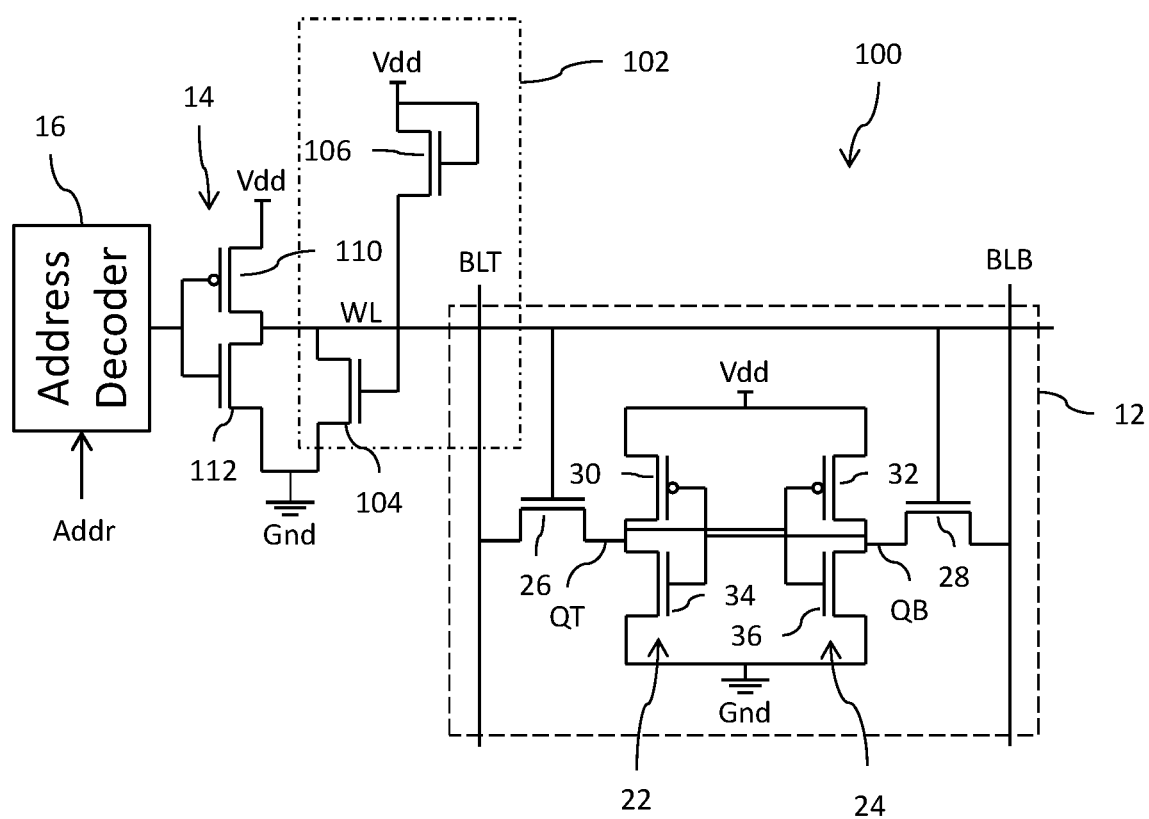
FIG. 2 is a schematic diagram of a memory circuit with read assist.

Reference is now made to FIG. 2 which shows a schematic diagram of a memory circuit 100 with read assist functionality. The memory circuit 100 includes a six transistor (6T) static random access memory (SRAM) cell 12, a wordline driver 14 and an address decoder 16 as shown in in FIG. 1. The circuit 100 of FIG. 2 differs from the circuit 10 of FIG. 1 by including a read assist circuit 102. The read assist circuit 102 includes an n-channel transistor 104 source-drain connected between the word line WL and the low supply node Gnd and a bias circuit configured to bias the control terminal (gate) of the transistor 104. The bias circuit comprises a diode-connected n-channel transistor 106 (gate connected to drain) that is source-drain connected between the high supply node Vdd and the gate of the transistor 104. The control terminal (gate) of the transistor 104 is biased by the diode-connected n-channel transistor 106 at a voltage of Vdd-Vt (where Vt is the threshold voltage of the transistor 106). The transistor 104 is biased into conduction and presents a resistance between the word line WL and the low supply node Gnd.

When the address decoder actuates the wordline through the wordline driver circuit 14, the p-channel transistor 110 in the wordline driver circuit 14 is turned on and the n-channel transistor 112 in the wordline driver circuit 14 is turned off. In the absence of biased transistor 104, the wordline WL would be pulled to the voltage Vdd. However, because transistor 104 is biased into conduction and presents a resistance between the word line WL and the low supply node Gnd, a voltage divider circuit is formed by the series-connected source-drain paths of transistors 104 and 110, and the voltage on the wordline WL is equal to Vdd-ΔV, wherein ΔV is the voltage drop across transistor 110. The voltage ΔV is a temperature dependent voltage.

At relatively lower temperatures, there will be a relatively higher voltage drop across the diode-connected n-channel transistor 106 (i.e., the voltage Vt of transistor 106 is higher). The bias voltage at the gate of the transistor 104 will accordingly be lower and the voltage across transistor 104 will be higher (i.e., the wordline WL voltage will be relatively higher) because the voltage drop ΔV across transistor 110 will be lower. So, at lower temperatures, the read assist circuit 102 provides for limited (restricted or minimal) underdrive of the wordline WL.

Conversely, at relatively higher temperatures, there will be a relatively lower voltage drop across the diode-connected n-channel transistor 106 (i.e., the voltage Vt of transistor 106 is lower). The bias voltage at the gate of the transistor 104 will accordingly be higher and the voltage across transistor 104 will be lower (i.e., the wordline WL voltage will be relatively lower) because the voltage drop ΔV across transistor 110 will be higher. So, at higher temperatures which are static noise margin (SNM) limited, the read assist circuit 102 provides for maximum underdrive of the wordline WL.

The read assist functionality provided by read assist circuit 102 accordingly provides dynamic adaptive control of the word line WL pull down (through transistor 104) as a function of temperature.

The following table illustrates control over the wordline WL voltage as a function of temperature by the read assist circuit 102 for a supply voltage Vdd of 0.6V with respect to the FS corner (fast n-channel, slow p-channel):

| −40° C. | 25° C. | 85° C. | 125° C. |
|---|---|---|---|
| 0.600 V | 0.590 V | 0.578 V | 0.575 V |

The following table illustrates control over the wordline WL voltage as a function of temperature by the read assist circuit 102 for a supply voltage Vdd of 0.8V with respect to the FS corner (fast n-channel, slow p-channel):

| −40° C. | 25° C. | 85° C. | 125° C. |
|---|---|---|---|
| 0.793 V | 0.781 V | 0.769 V | 0.763 V |

Figure 3:
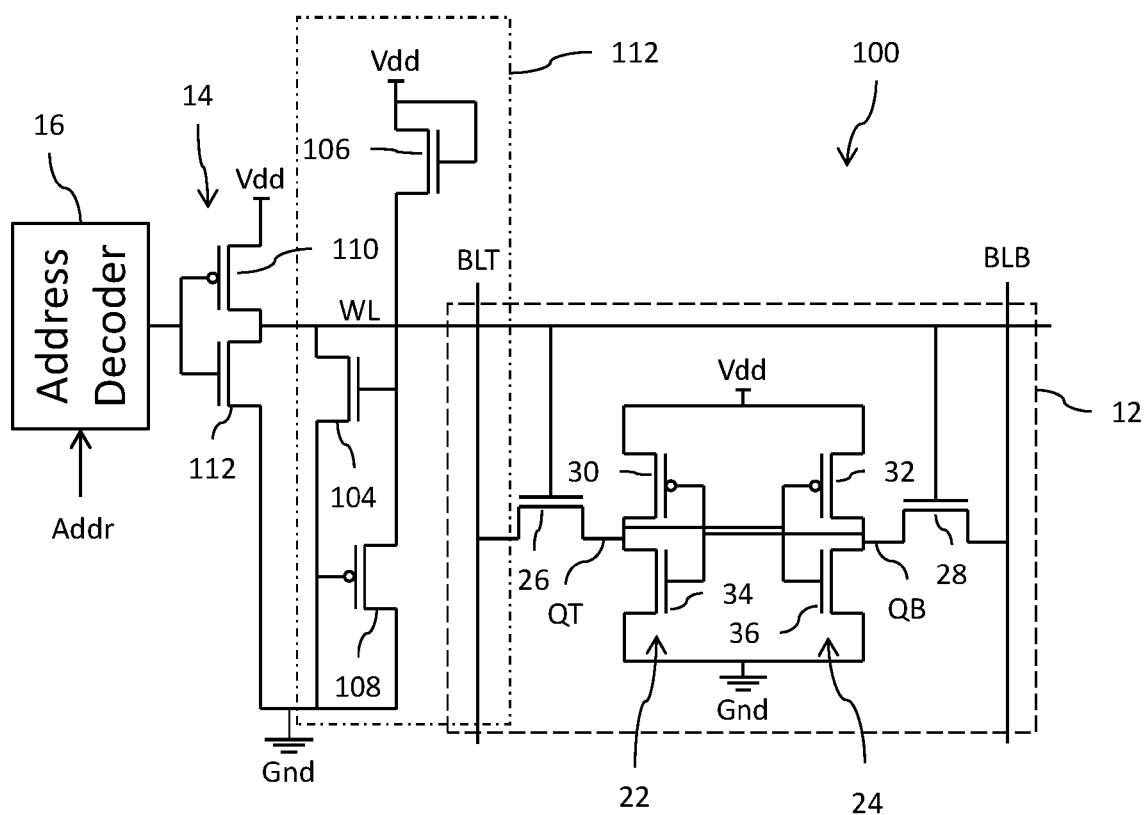
FIG. 3 is a schematic diagram of a memory circuit with read assist.

Reference is now made to FIG. 3 which shows a schematic diagram of a memory circuit 100 with read assist functionality. The memory circuit 100 includes a six transistor (6T) static random access memory (SRAM) cell 12, a wordline driver 14 and an address decoder 16 as shown in in FIG. 1. The circuit 100 of FIG. 3 differs from the circuit 10 of FIG. 1 by including a read assist circuit 112. The read assist circuit 112 includes an n-channel transistor 104 source-drain connected between the word line WL and the low supply node Gnd and a bias circuit configured to bias the control terminal (gate) of the transistor 104. The bias circuit comprises a diode-connected n-channel transistor 106 (gate connected to drain) that is source-drain connected between the high supply node Vdd and the gate of the transistor 104 and a diode-connected p-channel transistor 108 (gate connected to drain) that is source-drain connected between the gate of the transistor 104 and the low supply node Gnd. The control terminal (gate) of the transistor 104 is biased by the combination of the diode-connected n-channel transistor 106 at a voltage of Vdd-Vtn (where Vtn is the threshold voltage of the transistor 106). The transistor 104 is biased into conduction and presents a resistance between the word line WL and the low supply node Gnd. The diode-connected p-channel transistor 108 functions as a voltage clamp setting the minimum voltage at control terminal (gate) of the transistor 104 equal to Vtp (where Vtp is the threshold voltage of the transistor 108).

When the address decoder actuates the wordline through the wordline driver circuit 14, the p-channel transistor 110 in the wordline driver circuit 14 is turned on and the n-channel transistor 112 in the wordline driver circuit 14 is turned off. In the absence of biased transistor 104, the wordline WL would be pulled to the voltage Vdd. However, because transistor 104 is biased into conduction and presents a resistance between the word line WL and the low supply node Gnd, a voltage divider circuit is formed by transistors 104 and 110, and the voltage on the wordline WL is equal to Vdd-ΔV, wherein ΔV is the voltage drop across transistor 110. This voltage ΔV is temperature dependent.

At relatively lower temperatures, there will be a relatively higher voltage drop across the diode-connected n-channel transistor 106 (i.e., the voltage Vtn of transistor 106 is higher). The bias voltage at the gate of the transistor 104 will accordingly be lower and the voltage across transistor 104 will be higher (i.e., the wordline WL voltage will be relatively higher) so that the ΔV voltage drop across transistor 110 is lower. So, at lower temperatures, the read assist circuit 112 provides for limited (restricted) underdrive of the wordline WL.

Conversely, at relatively higher temperatures, there will be a relatively lower voltage drop across the diode-connected n-channel transistor 106 (i.e., the voltage Vtn of transistor 106 is lower). The bias voltage at the gate of the transistor 104 will accordingly be higher and the voltage across transistor 104 will be lower (i.e., the wordline WL voltage will be relatively lower) so that the ΔV voltage drop across transistor 110 is higher. So, at higher temperatures which are static noise margin (SNM) limited, the read assist circuit 112 provides for maximum underdrive of the wordline WL.

The read assist functionality provided by read assist circuit 112 accordingly provides dynamic adaptive control of the word line WL pull down (through transistor 104) as a function of temperature.

Figure 4:
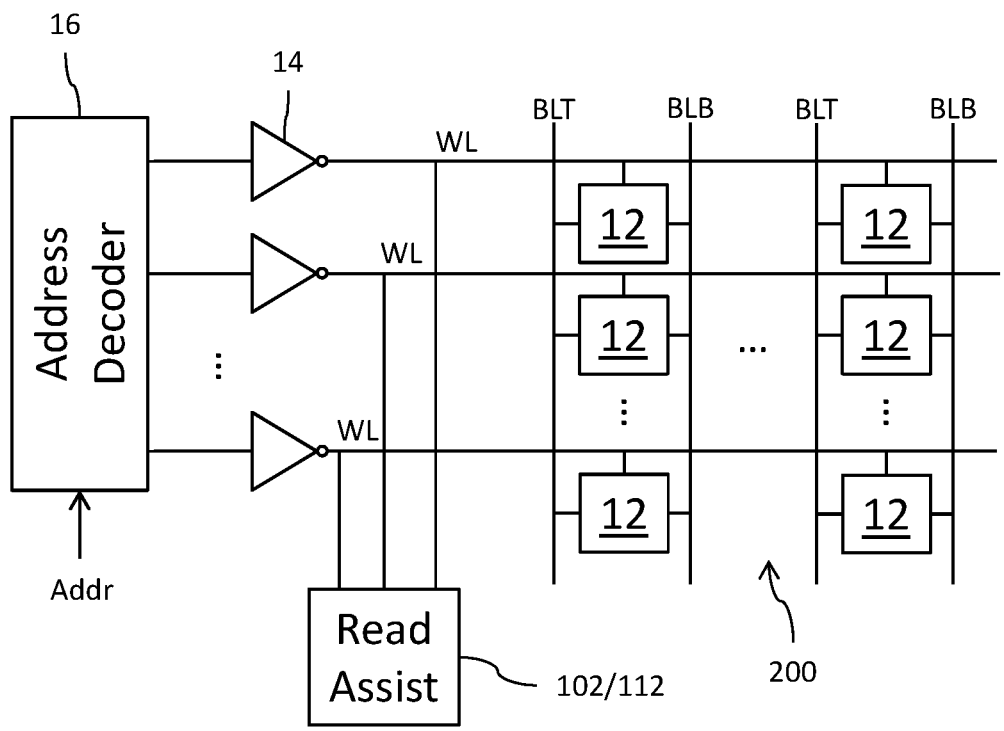
FIG. 4 illustrates implementation of the read assist function for a memory array.

Reference is now made to FIG. 4 showing the implementation of the read assist function for a memory array 200. The array 200 includes a plurality of memory cells 12 arranged in rows and columns. A wordline WL is provided for each row and is connected to the passgate transistors of the cells 12 in that row. The read assist circuit 102/112 is connected to each wordline WL of the memory array 200. In one embodiment, a single transistor 104 is connected to a plurality of wordlines. In another embodiment, a transistor 104 is provided for each wordline. In this implementation, a single bias circuit can be connected to the gate terminal of multiple transistors 104.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A circuit, comprising:
a wordline;
a plurality of memory cells connected to the wordline;

a pull-down transistor having a source-drain path connected between the wordline and a ground node; and
a bias circuit configured to apply a temperature dependent biasing voltage to a control terminal of the pull-down transistor;
wherein the bias circuit comprises:
a first diode-connected transistor coupled between a positive supply voltage node and the control terminal of the pull-down transistor; and
a second diode-connected transistor coupled between the control terminal of the pull-down transistor and the ground node.

2. The circuit of claim 1, further comprising a wordline driver circuit including a p-channel pull-up transistor, said pull-down transistor being an n-channel transistor.

3. The circuit of claim 1, wherein the first diode-connected transistor is an n-channel transistor and the second diode-connected transistor is a p-channel transistor.

4. The circuit of claim 1, wherein the first diode-connected transistor is an n-channel transistor.

5. The circuit of claim 1, wherein the temperature dependent biasing voltage varies as a function of temperature dependent change in a threshold voltage of the first diode-connected transistor.

6. The circuit of claim 1, wherein the temperature dependent biasing voltage is relatively lower for lower temperatures and relatively higher for higher temperatures.

7. A circuit, comprising:
a wordline;
a plurality of memory cells connected to the wordline;
a pull-down transistor having a source-drain path connected between the wordline and a ground node; and
a bias circuit configured to apply a temperature dependent biasing voltage to a control terminal of the pull-down transistor, said bias circuit include a clamp circuit operating to clamp a minimum value of the temperature dependent biasing voltage to a voltage level higher than a voltage at the ground node.

8. A circuit, comprising:
a wordline;
a plurality of memory cells connected to the wordline;
a wordline driver circuit including a p-channel pull-up transistor;
an n-channel pull-down transistor having a source-drain path connected between the wordline and a ground node; and
an n-channel diode-connected transistor having a source-drain path connected between a positive supply node and a gate terminal of the n-channel pull-down transistor, said n-channel diode-connected transistor configured to apply a biasing voltage to the gate terminal of the n-channel pull-down transistor that is a relatively lower voltage for relatively lower temperatures and a relatively higher voltage for relatively higher temperatures.

9. The circuit of claim 8, further comprising a p-channel diode-connected transistor coupled between the control terminal of the pull-down transistor and the ground node and functioning to clamp a minimum voltage at the gate terminal of the n-channel pull-down transistor.

10. A circuit, comprising:
a wordline;
a plurality of memory cells connected to the wordline;
a pull-down transistor having a source-drain path connected between the wordline and a ground node;
a bias circuit configured to apply a temperature dependent biasing voltage to a control terminal of the pull-down transistor; and
a clamping circuit configured to clamp a minimum value of the temperature dependent biasing voltage to a value that is at least a transistor threshold voltage above a voltage at the ground node.

11. The circuit of claim 10, further comprising a wordline driver circuit including a p-channel pull-up transistor, said pull-down transistor being an n-channel transistor.

12. A circuit, comprising:
a wordline;
a plurality of memory cells connected to the wordline;
a wordline driver circuit including a p-channel pull-up transistor, said pull-down transistor being an n-channel transistor;
a pull-down transistor having a source-drain path connected between the wordline and a ground node; and
a bias circuit configured to apply a temperature dependent biasing voltage to a control terminal of the pull-down transistor, wherein a minimum value of the temperature dependent biasing voltage is clamped;
wherein the bias circuit comprises a first diode-connected transistor coupled between a positive supply voltage node and the control terminal of the pull-down transistor.

13. The circuit of claim 12, wherein the bias circuit further comprises a second diode-connected transistor coupled between the control terminal of the pull-down transistor and the ground node.

14. The circuit of claim 13, wherein the first diode-connected transistor is an n-channel transistor and the second diode-connected transistor is a p-channel transistor.

15. The circuit of claim 12, wherein the first diode-connected transistor is an n-channel transistor.

16. The circuit of claim 12, wherein the temperature dependent biasing voltage varies as a function of temperature dependent change in a threshold voltage of the first diode-connected transistor.

17. The circuit of claim 10, wherein the temperature dependent biasing voltage is relatively lower for lower temperatures and relatively higher for higher temperatures.

18. A circuit, comprising:
a wordline;
a plurality of memory cells connected to the wordline;
a pull-down transistor having a drain terminal directly connected to the wordline and a source terminal coupled to a ground node; and
a bias circuit configured to apply a temperature dependent biasing voltage to a control terminal of the pull-down transistor;
wherein the bias circuit comprises a first diode-connected transistor coupled between a positive supply voltage node and the control terminal of the pull-down transistor; and
wherein the first diode-connected transistor is an n-channel transistor.

19. The circuit of claim 18, further comprising a wordline driver circuit including a p-channel pull-up transistor, said pull-down transistor being an n-channel transistor.

20. The circuit of claim 19, wherein the bias circuit further comprises a second diode-connected transistor coupled between the control terminal of the pull-down transistor and the ground node.

21. The circuit of claim 20, wherein the first diode-connected transistor is an n-channel transistor and the second diode-connected transistor is a p-channel transistor.

22. The circuit of claim 18, wherein a minimum value of the temperature dependent biasing voltage is clamped.

* * * * *